(12) United States Patent
Fritze et al.

(10) Patent No.: US 6,818,389 B2
(45) Date of Patent: Nov. 16, 2004

(54) METHOD OF DESIGN AND FABRICATION OF INTEGRATED CIRCUITS USING REGULAR ARRAYS AND GRATINGS

(75) Inventors: Michael Fritze, Acton, MA (US); Brian Tyrrell, Riverside, RI (US)

(73) Assignee: Massachusetts Institute of Technology, Cambridge, MA (US)

(*) Notice: Subject to any disclaimer, the term of this patent is extended or adjusted under 35 U.S.C. 154(b) by 207 days.

(21) Appl. No.: 09/952,185

(22) Filed: Sep. 13, 2001

(65) Prior Publication Data

US 2002/0045136 A1 Apr. 18, 2002

Related U.S. Application Data

(60) Provisional application No. 60/232,451, filed on Sep. 13, 2000, and provisional application No. 60/271,850, filed on Feb. 27, 2001.

(51) Int. Cl.[7] .................................................. G03F 7/00
(52) U.S. Cl. ...................... 430/394; 430/312; 430/396
(58) Field of Search ................................ 430/394, 396, 430/311–313; 716/19–21

(56) References Cited

U.S. PATENT DOCUMENTS

| | | | |
|---|---|---|---|
| 5,415,835 A | 5/1995 | Brueck et al. | 430/311 |
| 5,424,154 A | 6/1995 | Borodovsky | |
| 5,472,814 A | 12/1995 | Lin | 430/5 |
| 5,635,316 A | 6/1997 | Dao | 430/5 |
| 5,766,829 A | 6/1998 | Cathey, Jr. et al. | 430/394 |
| 5,772,905 A * | 6/1998 | Chou | 438/700 |
| 5,858,580 A | 1/1999 | Wang et al. | 430/5 |
| 6,042,998 A * | 3/2000 | Brueck et al. | 430/316 |
| 6,184,151 B1 | 2/2001 | Adair et al. | 438/743 |

(List continued on next page.)

FOREIGN PATENT DOCUMENTS

| | | |
|---|---|---|
| EP | 0 915 384 A2 | 5/1999 |
| EP | 0 915 384 | 5/1999 |
| EP | 0 986 094 | 9/1999 |
| EP | 0 986 094 | 3/2000 |
| EP | 0 997 781 | 5/2000 |
| WO | WO 98/02784 | 1/1998 |
| WO | WO 00/25181 | 5/2000 |
| WO | WO 01/06320 | 1/2001 |

OTHER PUBLICATIONS

Levenson et al., "The SCAA Mask and Phase Phirst!," *Canon Submicron Focus*, Spring 2001, pp. 7–8.

(List continued on next page.)

*Primary Examiner*—Mark F. Huff
*Assistant Examiner*—Kripa Sagar
(74) *Attorney, Agent, or Firm*—Gauthier & Connors LLP

(57) ABSTRACT

A circuit fabrication and lithography process utilizes a mask including dense repetitive structures of features that result in a wide array of fine densely populated features on the exposed substrate film. Following this, a trimming procedure is performed to remove any unwanted fine patterned features providing multiple trimmed patterns on the substrate. An optional final step adds additional features as well as the interconnect features thus forming a circuit pattern. In this manner, all fine features may be generated using the exact same density of intensity patterns, and therefore, maximum consistency between features is established without the need for optical proximity correction. The secondary exposures are substantially independent from the initial dense-feature exposure in that the exposure of one set of features and the subsequent exposure of another set of features result in separate independent resist or masking layer reactions, thus minimizing corner rounding, line end shortening and other related spatial frequency effects and unwanted exposure memory effects.

157 Claims, 6 Drawing Sheets

U.S. PATENT DOCUMENTS

| | | | |
|---|---|---|---|
| 6,274,281 B1 * | 8/2001 | Chen | 430/5 |
| 6,337,175 B1 * | 1/2002 | Yamaguchi | 430/322 |
| 6,351,304 B1 * | 2/2002 | Kawashima et al. | 430/311 |
| 6,387,596 B2 * | 5/2002 | Cole et al. | 430/311 |
| 6,403,291 B1 * | 6/2002 | Kawashima et al. | 430/394 |
| 6,534,242 B2 * | 3/2003 | Sugita et al. | 430/312 |
| 6,541,165 B1 * | 4/2003 | Pierrat | 430/5 |

OTHER PUBLICATIONS

M.D. Levenson, "Strong Phase Shift Mask Designs with Lower Cost," *Solid State Technology*, Jan. 2001, pp. 104 and 107.

Levenson et al., "Phase Phirst! An Improved Strong–PSM Paradigm," *20th Annual BACUS Symposium on Photomask Technology, Proceedings of SPIE*, vol. 4186 (2001), pp. 395–404.

Nakao et al., "0.12µm Hole Pattern Formation by KrF Lithography for Giga Bit DRAM," *IEDM*, 1996, pp. 61–64.

Nakao et al., "0.32µm Pitch Random Line Pattern Formation by Dense Dummy Pattern and Double Exposure in KrF Wavelength," *In Optical Microlithography XIII, Proceedings of SPIE*, vol. 4000 (2000), pp. 1123–1133.

Suzuki et al., "Multilevel Imaging System Realizing $K_1$=0.3 Lithography," *Part of the SPIE Conference on Optical Microlithography XII*, SPIE, vol., 3679 (1999), pp. 396–407.

Fukuda et al., "0.3–µm Pitch Random Interconnect Patterning with Node Connection Phase–Shifting Mask—Experiments and Simulations," *In Optical Microlithography XIII, Proceedings of SPIE*, vol. 4000 (2000), pp. 149–159.

Kahng et al., "Subwavelength Lithography and its Potential Impact on Design and EDA," *Design Automation Conference (DAC) Proceedings* (1999), pp. 799–804.

Levinson et al., "Chapter 1: Optical Lithography," *Handbook of Microlithography, Micromachining, and Microfabrication: vol. 1: Microlithography*, Ed. P. Rai–Choudhury, 1997, pp. 11,12, 68–82.

Levenson et al., "Improving Resolution in Photolithography with a Phase–Shifting Mask," *IEEE Transactions on Electron Devices*, vol. Ed.–29, No. 12, Dec. 1982, pp. 1828–1836.

Fritze et al., "Sub–100nm Silicon on Insulator Complimentary Metal–Oxide Semiconductor Transistors by Deep Ultraviolet Optical Lithography," *J. Vac. Sci. Technol.B.—American Vacuum Society*—18(6), Nov./Dec. 2000, pp. 2886–2890.

Fritze et al., "Application of Chromeless Phase–Shift Masks to Sub–100nm SOI CMOS Transistor Fabrication," *In Optical Microlithography XII, Proceedings of SPIE*, vol. 4000 (2000), pp. 388–407.

Toublan et al., "Phase Aware Proximity Correction for Advanced Masks," *In Optical Microlithography XII, Proceedings of SPIE*, vol. 4000 (2000), pp. 160–170.

Liu et al., "The Application of Alternating Phase–Shifting Masks to 140nm Gate Patterning (II): Mask Design and Manufacturing Tolerances," *In Optical Microlithography XI, Proceedings of SPIE*, vol. 3334 (1998), pp. 2–14.

Wang et al., "Patterning 80–nm Gates Using 248–nm Lithography: An Approach for 0.13 Micron VLSI Manufacturing," *In Optical Microlithography XIV, Proceedings of SPIE*, vol. 4346 (2001), pp. 1–14.

Fritze et al., "100–nm Node Lithography with KrF?," *In Optical Microlithography XIV, Proceedings of SPIE*, vol. 4346 (2001), (15 pages).

Fritze et al., "GRATEFUL Phase Shifting: Gratings of Regular Arrays and Trim Exposures for ULSI Lithography," *Journal of Vacuum Science & Technology B*, Nov./Dec. 2001 (In Press), 24 pages.

Fritze et al., "Nanofabrication with Deep–Ultraviolet Lithography and Resolution Enhancements," *J. Vac. Sci. Technol. B.—American Vacuum Society*—17(6), Nov./Dec. 1999, pp. 3310–3313.

Fukuda et al., "Patterning of Random Interconnect Using Double Exposure of Strong–Type PSMs," *In Optical Microlithography XIV, Proceedings of SPIE*, vol. 4346 (2001), 8 pages.

* cited by examiner

METHOD OF DESIGN AND FABRICATION OF INTEGRATED CIRCUITS USING REGULAR ARRAYS AND GRATINGS

PRIORITY INFORMATION

This application claims priority from provisional applications Ser. No. 60/232,451 filed Sep. 13, 2000 and Ser. No. 60/271,850 filed Feb. 27, 2001.

This invention was made with government support under Contract Number F19628-95-C-0002 awarded by the Air Force. The government has certain rights in the invention.

FIELD OF THE PRESENT INVENTION

The present invention is directed to the fabrication of integrated circuits using arrays, gratings, and/or laser interferometry. More particularly, the present invention is directed to a process and methodology of fabricating integrated circuits that accounts for both optical proximity and spatial frequency effects while maintaining the resolution-enhancement characteristics required by sub-wavelength lithography.

BACKGROUND OF THE PRESENT INVENTION

Conventional optical projection lithography has been the standard silicon patterning technology for the past 20 years. It is an economical process due to its inherently high throughput thereby providing a desirable low cost per part or die produced. A considerable infrastructure (including steppers, photomasks, resists, metrology, etc) has been built up around this technology.

In this process, a mask, or "reticle", includes a semiconductor circuit layout pattern typically formed of opaque chrome, on a transparent glass (typically $SiO_2$) substrate. A stepper includes a light source and optics/lenses that project light coming through the reticle and image the circuit pattern, typically with a 4× to 5× reduction factor, on a photo-resist film formed on a silicon wafer. The term chrome refers to an opaque masking material that is typically but not always comprised of chrome. The transmission of the opaque material may also vary such as in the case of an attenuating phase shift mask.

FIG. 1 is an example of a conventional optical projection lithography apparatus. As illustrated in FIG. 1, the optical projection lithography apparatus includes a light source 20, a photomask 22, and reduction optics 24. A wafer 26, having a layer of photo-resist 28 thereon, is placed within the optical projection lithography apparatus, and the light-source 20 generates a beam of light 21 that is incident upon the photomask 22. The reduction optics 24 reduces the light beam to cause a pattern 30 that exposes the photo-resist layer 28, creating the pattern 30 of reacted material in the resist layer 28. In this manner, a pattern 32, provided on the mask 22, is transferred to the photo-resist layer 28 on the wafer 26.

The photo-resist pattern 30 is then transferred to the underlying wafer 26 through standard etching processes using standard semiconductor fabrication techniques. Both positive and negative tone resists can be used to produce either positive or negative images of the mask pattern on the wafer.

As the semiconductor industry continues to evolve and grow, feature sizes of the pattern are driven to an ever-smaller resolution. The driving force is the desire of these industries to remain on the "Moore's Law" growth curve. The "Moore's Law" growth curve calls for an exponential increase of circuit density versus production year that is typically accomplished by decreasing feature sizes. However, the resolution of an optical stepper is limited by the wavelength of the light source, and is further limited by the numerical aperture ("NA") of the lens.

The basic lithographic imaging relationships are:
1) Resolution=$k_1$/NA; and
2) Depth of Focus=$k_2$/(NA)$^2$;

where is the illumination wavelength, NA is the lens numerical aperture, and $k_1$ and $k_2$ are process constants.

In general, a shorter wavelength light source and/or a higher numerical aperture lens affords a higher-resolution system. State-of-the-art light sources provide a beam having a wavelength of approximately 193 nanometers. As stated above, the semiconductor industry has been driving the need for critical feature sizes to decrease exponentially over time while exposure light sources have only been decreasing linearly with time.

Carrying this scenario forward, current and future optical lithography will be required to image feature sizes of sub-wavelength dimensions. Sub-wavelength optical lithography has been realized with the 180-nm device generation fabricated using 248-nm optical lithography.

As noted above, the numerical aperture of the lens also drives resolution. In this field, the cost of lenses having very high numerical apertures ("NA") approaching 0.8 is very high. Moreover, linear NA increases are not sufficient to maintain pace with the need for exponentially decreasing feature sizes.

To meet this demand, Resolution-Enhanced optical lithography Technologies ("RET") have become popular as techniques for providing patterns with sub-wavelength resolution. These methods include off-axis illumination ("OAI"), optical proximity correction ("OPC"), and phase-shift masks ("PSMs"). Such resolution-enhanced optical lithography methods are especially useful for generating physical devices on a wafer that require small size and tight design tolerance. Examples of such physical devices are the gate length of a transistor or the dimensions of contact cuts formed in inter-layer dielectrics. However, the conventional RET methods face problems with layout complexity and data size, mask fabrication complexity and resulting cost, and optical proximity effects (CUT effects) and spatial frequency effects which are discussed below.

In many circuit applications, it is an important design constraint that the respective sizes of the narrow lines are consistent throughout the circuit. For example, in a semiconductor device, the narrow lines may form transistor gates, and it is important that the transistor gates are similar in size so that the circuit has consistent and predictable gate delay values.

In general, in any optical lithography technique, the resulting optical image intensity is a function of the proximity of features. Contrast is lost as feature pitch values decrease. As a result, the resulting size of features located in densely populated regions can be different than the size for those features that are isolated from the densely populated features. This is known as the "optical proximity" effect.

With respect to optical proximity effect, the critical dimension of features depends on feature density. Moreover, optical proximity effects can become more severe in sub-wavelength lithography. The optical proximity effects can result in dense lines 261 and isolated line 262 on wafer 26 being printed with different sizes, even if the same size on the mask, as illustrated in FIG. 2, or dense contacts 263 and isolated contact 264 on wafer 26 being printed with different sizes, even if the same size on the mask, as illustrated in FIG.

3. Since the performance of the circuit depends on the size and size tolerance of the gates, this is an undesirable result.

Spatial frequency effects are caused by the "low-pass filter" behavior of a projection lithography lens wherein high spatial frequencies do not pass through the lens. This results in corner rounding and line end shortening. An example of this effect is illustrated in FIG. 4. As illustrated in FIG. 4, a desired image is represented by mask 220, but the actual image pattern 265 on the wafer is shortened and rounded.

To compensate for optical proximity and spatial frequency effects, additional features have been conventionally introduced on the mask that can involve both printable as well as sub-resolution elements. In these methods, extra features such as serifs, mousebites, hammerheads, and scattering bars are added to the mask features in order to correct for optical proximity effects and other spatial frequency effects. These conventional methods involve sophisticated algorithms with very large data size, as different corrections are required for each separation distance between the features. For this reason, conventional feature size correction ("OPC" or optical proximity correction) is a costly and time-consuming process.

Conventional OPC generally involves the processing of an enormous data volume. The hierarchical data processing algorithms used for conventional circuit design are of limited utility because optical proximity effects are based on the nature of geometries surrounding a particular circuit element. For example, a 1× AND gate surrounded by registers on all sides will perform differently than a 1× AND gate surrounded by other 1× AND gates. Other examples of conventional lithography methods addressing the need for finer features or higher-resolution features will be discussed below.

U.S. Pat. No. 5,415,835-B1 ("Brueck et al.") discusses a method of fine-line imaging based on laser interferometry. In Brueck et al., dense gratings formed by laser interferometry are customized by additional exposures using both interferometric and conventional lithography. Brueck et al. does not address optical proximity and spatial frequency effect problems thus limiting the ultimate density and flexibility of the patterns produced. In addition, the multiple exposures are not substantially independent in the optical sense due to the resist's "memory" of previous exposure patterns. It is also difficult to make an arbitrary two-dimensional pattern in this way.

EP-0915384-A2 ("Suzuki et al.") expands upon interferometric lithography. Suzuki et al. discloses using interferometric one-dimensional gratings to realize fine-line lithography together with subsequent customization exposures using multiplex (subthreshold) exposure doses. Suzuki et al. does not address optical proximity and spatial frequency effect problems thus limiting the ultimate density and flexibility of the patterns produced. The multiple exposures are not substantially optically independent due to the resist's "memory" of the previous exposures. It is also difficult to realize an arbitrary 2D pattern with this method. Since the fine features are only realized in one orientation, it is difficult to form patterns with fine features in both the x & y directions.

WO-1/06320-A1 ("Levenson") discloses re-usable "master" fine feature phase-shift masks that can be customized by multiple exposure methods using conventional masks. Levenson discloses a "trade-off between a maximum density of features against the cost for low volume runs". Thus, the target application is primarily ASIC and thin-film head patterns where the pattern density is not too great. Just as in the previous Patents discussed above, this method does not mitigate optical proximity and spatial frequency effects. It does not include substantially independent multiple exposures.

Finally, U.S. Pat. No. 6,184,151-B1 ("Adair et al.") discloses a method for forming square shape images wherein a first plurality of lines running in a first direction is defined in a first layer, and then a second resist is defined wherein the lines run in an intersecting pattern to those of the first layer, thereby creating sharp corners wherever the first and second layers intersect and in open areas between the lines. This process addresses the spatial frequency effect problems of corner rounding and line-end shortening, but does not resolve the optical proximity effect problem. The control of fine features through pitch is important in order to realize the maximum pattern density and flexibility for applications.

It is therefore desirable to develop an imaging method that mitigates optical proximity and spatial frequency effects without adding complex optical proximity correction features to the mask, while preserving the resolution enhancement aspects required by sub-wavelength lithography. This is especially desirable since conventional optical proximity correction approaches are becoming quite difficult to implement as imaging requirements continue to move deeper into the sub-wavelength regime.

It is also desirable to eliminate basic optical proximity effects, involving the imaging of fine lines in the x and y directions through a variety of pitch values and to minimize spatial frequency effects such as corner rounding and line-end shortening by the use of multiple, "substantially independent" optical exposures. The phrase, "substantially independent imaging," means that the exposure of one set of features and the subsequent exposure of another set of features result in separate independent resist or masking layer reactions.

It is further desirable to simplify circuit layout and mask fabrication, resulting in lower cost and substantially decreased data volume required for a typical design, thereby allowing for design of standard cells that can be accurately characterized independently of their eventual placement in a larger circuit.

SUMMARY OF THE PRESENT INVENTION

One aspect of the present invention is a method of forming patterns on a substrate. The method exposes the substrate to provide a pattern of dense features and exposes the substrate to provide multiple trimmed patterns on the substrate, the trimmed patterns including both densely populated and sparsely populated regions of features, the critical dimension of the features in the densely populated regions and sparsely populated regions being substantially independent of feature density.

Another aspect of the present invention is a mask set for a process for providing patterns on a substrate. The mask set includes a fine feature mask containing a pattern of dense features and a trim mask for producing multiple trimmed patterns of fine features.

A third aspect of the present invention is a design method. The design method designs standard circuit subcell designs wherein all fine features lie on a regular pattern. The designing of the standard circuit subcell designs is compatible with a method of forming patterns on a substrate by exposing the substrate to provide a pattern of dense features and exposing the substrate to provide multiple trimmed patterns on the substrate, the trimmed patterns including both densely populated and sparsely populated regions of features, the critical dimension of the features in the densely populated regions and sparsely populated regions being substantially independent of feature density.

A fourth aspect of the present invention is a design method. The design method designs standard circuit subcell designs wherein all fine features lie on a regular pattern. The designing of the standard circuit subcell designs is compatible with a mask set for providing patterns on a substrate having a fine feature mask containing a pattern of dense features and a trim mask for producing multiple trimmed patterns of fine features.

A fifth aspect of the present invention is a computer-aided design methodology. The computer-aided design methodology assumes a first template of dense-only features as a first mask level and places a first set of trim features on a second mask level to coincide with selected features on the first template, such that a first subset or superset of features desired for fabrication correspond to a geometric function of the first template and the first set of trim features.

A sixth aspect of the present invention is a design methodology. The design methodology assumes a first template of dense-only features as a first mask level and places a first set of trim features on a second mask level to coincide with selected features on the first template, such that a first subset or superset of features desired for fabrication correspond to a geometric function of the first template and the first set of trim features.

A seventh aspect of the present invention is a method of forming a random contact array on a substrate. The method exposes the substrate to provide a pattern of dense contact features of a predetermined pitch and critical dimension and exposes the substrate to provide multiple trimmed patterns on the substrate, the trimmed patterns including both densely populated and sparsely populated regions of features, the critical dimension of the features in the densely populated regions and sparsely populated regions being substantially independent of feature density.

An eighth aspect of the present invention is a method for defining multiple fine feature critical dimensions in a resist for a single feature definition exposure. The method exposes a substrate with a feature definition exposure and sub-threshold exposes the substrate using a gray-tone mask to locally partially expose different regions of the substrate, thereby allowing for a range of critical dimensions to be defined by the feature definition exposure.

BRIEF DESCRIPTION OF THE DRAWINGS

The present invention may take form in various components and arrangements of components, and in various steps and arrangements of steps. The drawings are only for purposes of illustrating a preferred embodiment or embodiments and are not to be construed as limiting the present invention, wherein.

DETAILED DESCRIPTION OF THE PRESENT INVENTION

Figure 1:
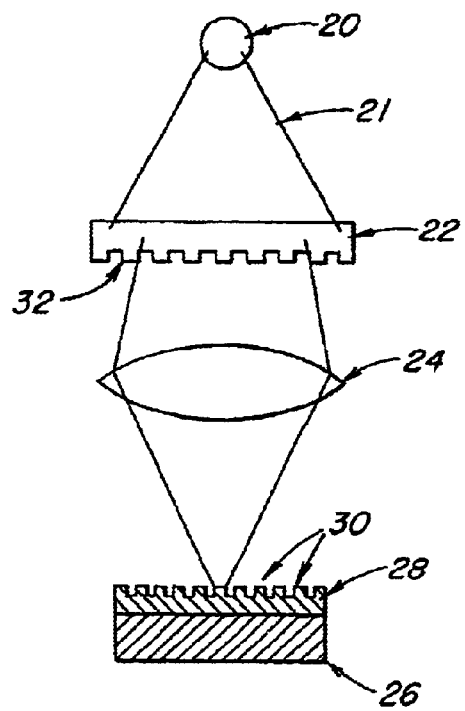
FIG. 1 is a schematic diagram of the lithography apparatus in accordance with the present invention.

The present invention is directed to an imaging approach that overcomes the limitations of the conventional techniques, and confers a number of advantages. It addresses the problems of optical proximity and spatial frequency effects while maintaining the resolution-enhancement performance required by sub-wavelength lithography.

In the following description, the phrase, "lines," refers to either the trenches or the raised areas; e.g., plateaus; on a wafer. Moreover, the phrase, "contacts," refers to either the holes or pillars on a wafer. The described photoresists may either be a negative tone or a positive tone. The descriptions are applicable to either positive or negative imaging of the wafer or substrate.

With respect to spatial frequency effects and optical proximity effects, any image that is lithographically exposed can be thought of in Fourier space, where components of various spatial frequencies sum to form the complete image. The lens acts as a low-pass filter because it has a finite aperture. Spatial frequency effects cause corner rounding and line-end shortening because higher diffraction orders are filtered out, but the first diffraction order passes through the lens unfiltered. Optical proximity effects cause the same features spatially apart from each other on a substrate to realize a size differential even though these features were formed using the same mask. This effect is typically described quantitatively in terms of critical dimension versus pitch.

Lastly, the phrase, "dense features," refers to an area on the substrate having a multitude of features positioned very closely to each other.

In the present invention, a mask is provided including a dense repetitive structure of features that results in a large array of densely populated features on the film or substrate. The pattern of dense features may be locally or globally periodic. The mask is designed to print dense features near the resolution limit of the lithography stepper used, thus defining a pattern "grid." The minimum width features (such as transistor gates and contacts) are laid out on this grid. The allowed feature grid locations are integer multiples of the minimum grid pitch.

Using this mask, the substrate is exposed to provide a pattern of regular dense features of a predetermined pitch and critical dimension. Following this first dense feature formation exposure, a trimming exposure is performed to remove any unwanted pattern features.

Optionally, an additional exposure is performed, adding further features as well as interconnecting the previously formed features to form a circuit. This exposure is substantially independent of the previous exposures, thus minimizing effects such as spatial frequency effects (corner rounding and line end shortening).

For example, when using less general dense fine feature masks, only two exposures are necessary: dense-grating and trim. On the other hand if a simple one-dimensional grating mask is used, three exposures are required: dense-grating, trim, and interconnect. In addition to the grid layout restriction, this particular embodiment also requires the minimum width features to be oriented in the same direction.

In the present invention, all small features are generated using the exact same density optical image patterns; and therefore, maximum consistency between features is established. The small features may comprise gates of transistors or contact holes. Small features are thus produced without the proximity effects realized by the conventional techniques using simple, reusable dense-grating masks. Customized and less expensive trimming masks can then be used to complete the desired pattern as well as interconnect the circuit components.

In this manner, only a single dense-grating is required for generating any of a number of different circuits and patterns. The re-usability of the dense-grating mask is desirable since this is often the most difficult and expensive mask to fabricate. This is especially true if the dense grating mask is a phase-shift mask. A phase-shift mask is capable of imaging dense features very close to the Rayleigh limit for optical projection steppers. (Pitch$_{MIN}$=0.5/(NA)).

As noted above, FIG. 1 is a schematic block diagram of a conventional optical projection lithography apparatus. The conventional optical projection lithography apparatus includes a light source 20, a photomask 22, and reduction optics 24. A wafer 26 having a layer of photoresist 28 is presented to the conventional optical projection lithography apparatus, and the light-source 20 generates a beam of light 21 that is incident upon the photomask 22 and reduced by reduction optics 24 to cause a pattern 30 to be exposed in the photoresist layer 28. In this manner, a pattern 32 provided on the mask 22 is transferred to the photoresist layer 28 on the wafer 26.

Figure 5:
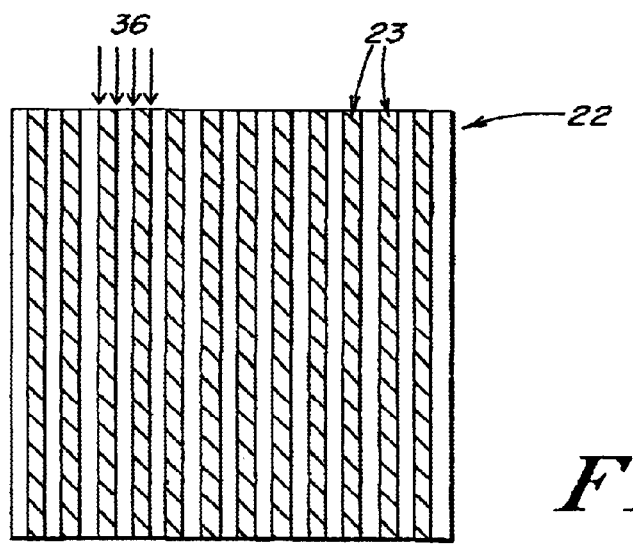
FIG. 5 is a top view of a phase-shift mask in accordance with a desired embodiment the present invention.
Figure 6:
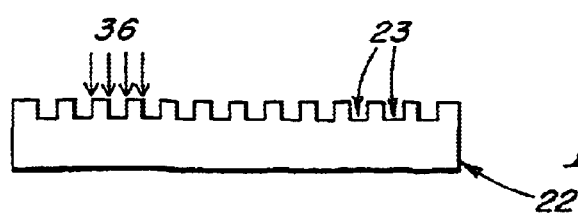
FIG. 6 is a side view of a phase-shift mask in accordance with a desired embodiment the present invention.
Figure 2:
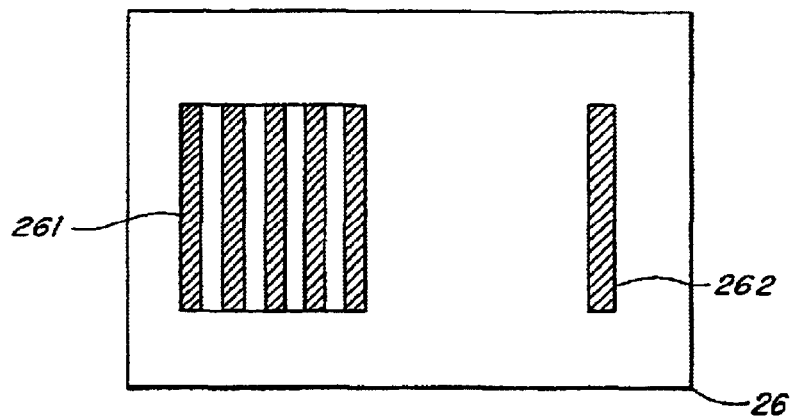
FIG. 2 is an illustration of an optical proximity effect with respect to fabricating lines.
Figure 3:
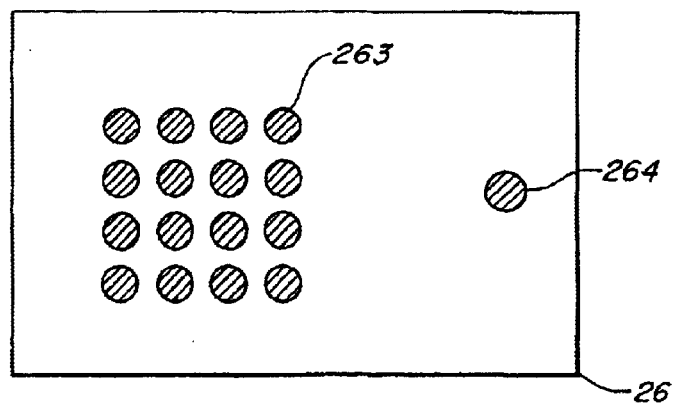
FIG. 3 is an illustration of an optical proximity effect with respect to fabricating contact holes or pillars.
Figure 4:
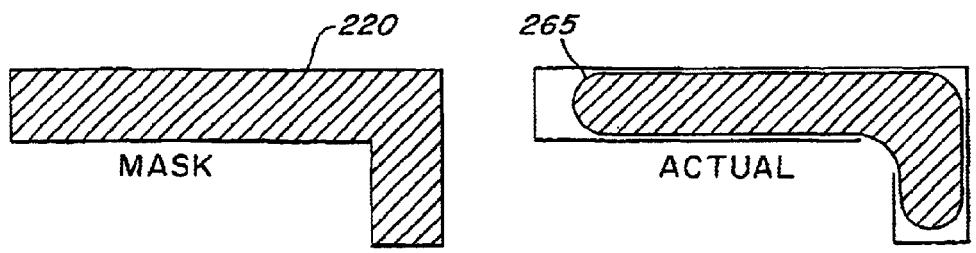
FIG. 4 is an illustration of a spatial frequency effect with respect to fabricating lines.

In a preferred embodiment of the present invention, the dense-feature mask 22 is a phase-shift mask comprising an interference pattern grating of periodic features. FIGS. 5 and 6 are top and side views, respectively, of a phase-shift mask that is a preferred embodiment of mask 22 used with respect to the present invention. The phase-shift mask 22 may be formed of, for example, fused SiO$_2$. Periodic trenches 23 are formed in the mask 22 to provide an interference pattern upon illumination that results in the desired photoresist pattern 30 on the wafer 26.

Although a simple one-dimensional mask grating is shown in FIGS. 5 and 6, the present invention is applicable to phase-shift masks of a variety of patterns. The present invention is also applicable to other types of phase-shift masks such as alternating aperture (AAPSM) or attenuating phase-shifters (APSM).

Figure 7:
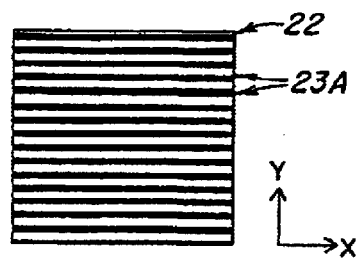
FIGS. 7–10 are top views of various dense-feature mask pattern configurations in accordance with the present invention.
Figure 8:
Figure 9:
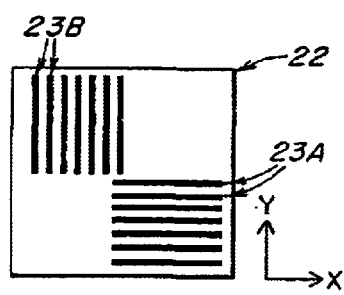

With reference to FIGS. 7–10, the line features 23A, 23B, and 23C can be formed in a variety of configurations. In the configuration of FIG. 7, horizontal line features 23A are formed parallel to each other in the X-direction, while in FIG. 8, vertical line features 23B are formed parallel to each other in the Y-direction. The mask shown in FIG. 9 includes features formed in a horizontal orientation 23A in a first region of the mask 22 and features formed in a vertical orientation 23B in a second region of the mask 22.

Note, however, that in alternative embodiments, the features may be formed in other patterns, including locally regular patterns. For example, in the mask of FIG. 10, a unique feature pattern 23C is employed. Other such unique combinations of patterns are applicable to the present invention.

Figure 11:
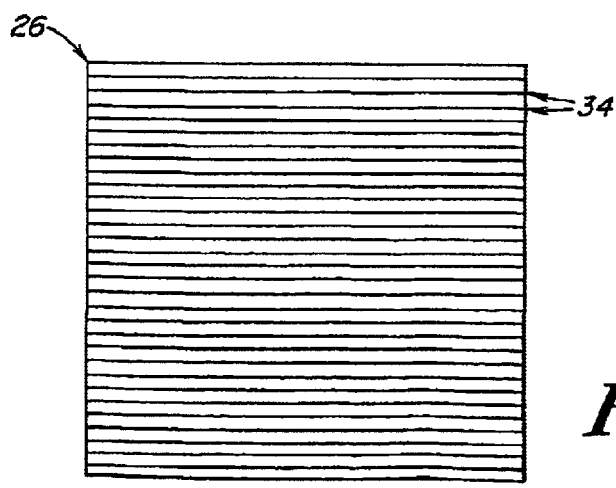
FIG. 11 is a top view of a wafer exposed by the dense feature mask of FIG. 7 in accordance with the present invention.

FIG. 11 is a top view of the resulting pattern formed on the wafer 26, assuming exposure by the dense feature mask 22 of FIG. 7. A plurality of periodic thin lines 34 of photoresist material are formed on the wafer 26 (in the case of a positive resist). A preferred embodiment of the present invention produces these grating features with a phase-shift mask.

Figure 12:
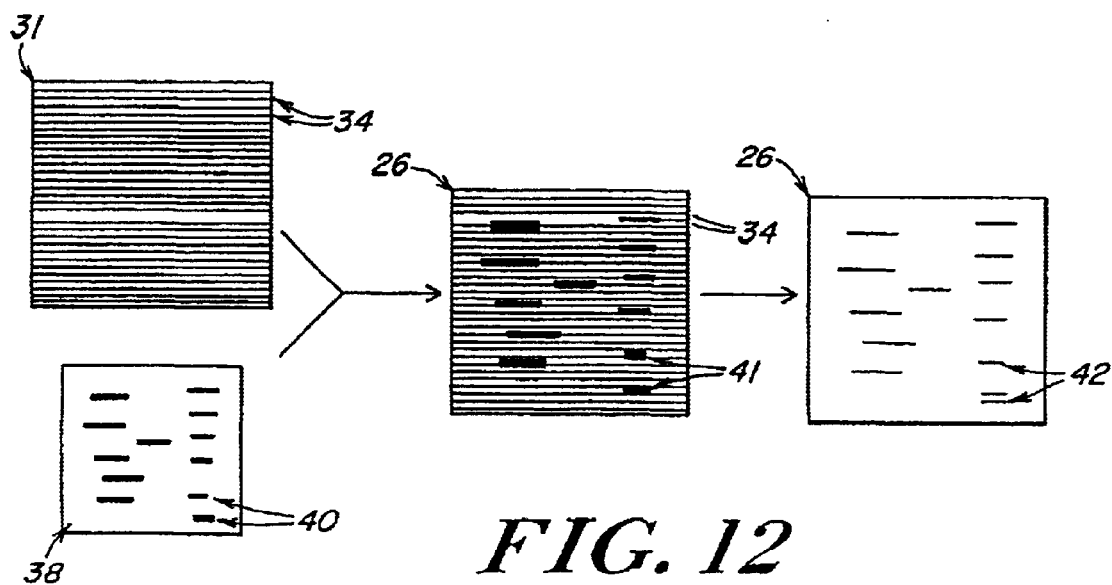
FIG. 12 is a graphical flow diagram illustrating top views of a wafer undergoing a trimming process in accordance with the present invention.
Figure 13:
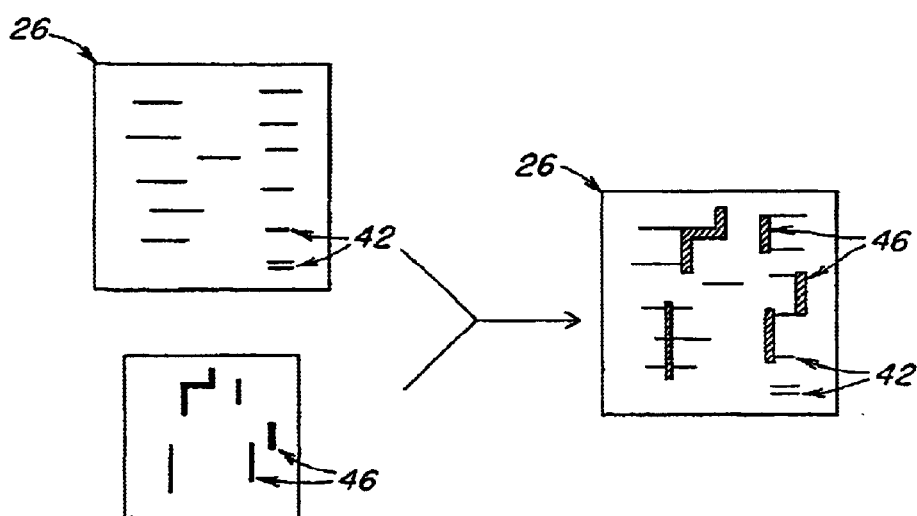
FIG. 13 is a graphical flow diagram illustrating top views of a wafer undergoing an interconnect process in accordance with the present invention.

As noted above, the present invention is directed to fabricating physical structures on a substrate or wafer. FIGS. 12 and 13 graphically illustrate a process for forming these structures according to the concepts of the present invention.

As shown in FIG. 12, a wafer or substrate 26 is exposed using a grating 31 which including a line pattern 34 to provide a pattern of regular dense lines or features of a predetermined pitch and critical dimension on the substrate 26. Thereafter, a trim mask 38 is exposed on the wafer 26.

For example, in the case of transistors having a consistent, narrow gate length, the gate length of each transistor corresponding to the width of each line, trim features 40 are formed on the customized trim mask 38 and exposed on the wafer 26 at corresponding locations 41 to form a resulting trimmed pattern 42, comprising a plurality of transistors of equal gate length along their critical dimension. In this manner, a standardized and relatively inexpensive dense fine feature mask 22 can be used to form the critical dimension of the transistor length under tight tolerance conditions.

This is combined with the customized trim mask 38 of relatively loose tolerance constraints to provide a trimmed pattern 42 on the wafer 26. A certain degree of misalignment can be tolerated on the trim mask 38 along with oversize and undersize error in the trim features 40, as well as exposure error. These loose tolerance constraints are acceptable because of the often relatively wide pitch, or distance, between centers of the narrow feature lines 34 and loose tolerance constraints are typical of trim exposures. Additionally, the critical dimension, width, of the feature lines 42 is not determined by the trim-mask features 40. It is generally easier to erase existing features than to accurately place new features. Thus, the present invention is especially amenable to applications involving a dense array of features at a minimal critical dimension.

Following formation of the trimmed pattern 42 on the wafer 26, the exposure of the trimmed pattern 42 is developed according to standard semiconductor chemical processes that alter the chemistry in the photo-resist. Following this, the wafer is subjected to a "hard bake" such that the photoresist is no longer susceptible to light. The wafer is then re-coated with photoresist in preparation for the pattern interconnection process.

With reference to FIG. 13, following formation of the trimmed and developed trim patterns 42 on the wafer 26, the fresh layer of photoresist on the wafer 26 is next exposed by an interconnect mask 44 including interconnect features 46.

In this manner, assuming the trimmed pattern 42 represents transistor gates, the interconnect features 46 provide a means for interconnecting the gates 42 so as to form a circuit. Again, in this case, the interconnect mask 44 is custom-designed for the particular circuit to be interconnected.

Since a standard dense feature mask 22 is used to generate patterns of fine lines with a given critical dimension in the circuit, the present invention is immune to optical proximity effects. For example, in the pattern of trimmed features 48 shown in FIG. 14, patterns 49A formed in densely populated region 50 of the pattern of trimmed features 48 and patterns 49B formed in a sparsely populated region 52 of the pattern of trimmed features 48 remote to the densely populated region 50 have identical feature sizes.

Figure 10:
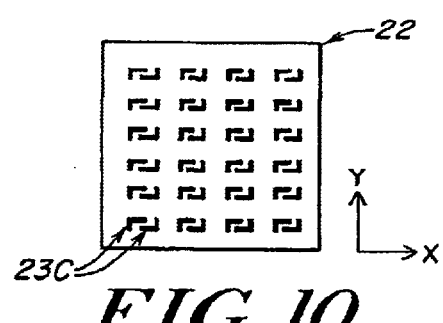

However, assuming the original dense feature mask 22 has more complex pattern, such as the "L"-shaped pattern 23C of FIG. 10, as these features become small, sharp features, such as corners and line-ends tend to become distorted. For this reason, various forms of optical proximity correction or spatial frequency correction features may be configured directly into the dense feature mask template in order to pre-distort the template pattern. For example, well-known techniques such as hammer-heads, serifs, and mouse bites may be added to the corner features so that the exposed final feature resembles the desired feature. By incorporating the optical proximity correction and/or spatial frequency correction directly in the dense feature mask, the standard features are automatically corrected on the dense feature mask rather than on the design-specific trim mask and interconnect mask, thereby providing an economically efficient solution to the optical proximity correction issue.

Figure 15:
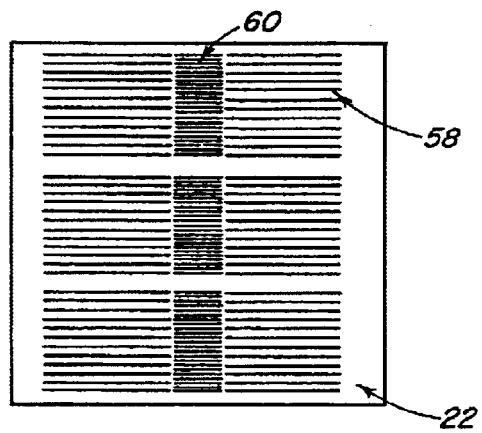
FIG. 15 is a top view of a dense feature mask including both printable features and sub-resolution features in accordance with the present invention.

With reference to FIG. 15, the present invention is also amenable to use with a dense feature mask 22 having sub-resolution gratings 60.

Figure 16:
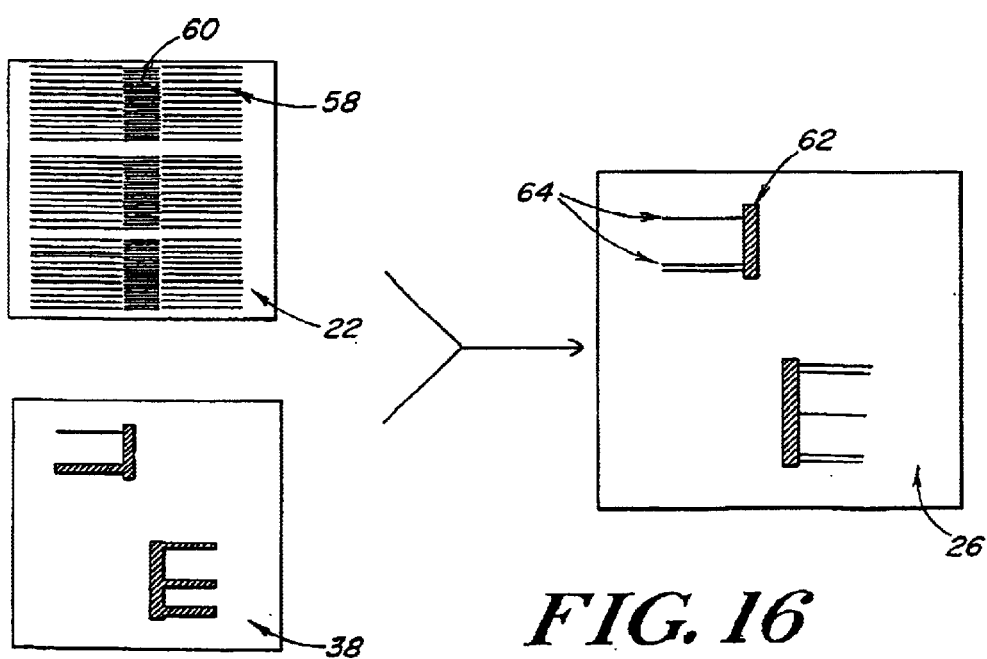
FIG. 16 is a graphical flow diagram illustrating a trimming operation performed on a wafer including solid patterns formed by exposure of the sub-resolution features of the dense feature mask of FIG. 15.

As illustrated in FIG. 16, printable features 58 of the dense feature mask 22 of FIG. 15, when exposed, result in fine features formed on the wafer 26, while the sub-resolution features 60 of the phase-shift mask 22 result in solid patterns on the wafer 26. Through the use of a trim mask 38, these solid patterns can be trimmed appropriately so as to form interconnects 62 between the trimmed fine features 64 as shown.

Figure 17:
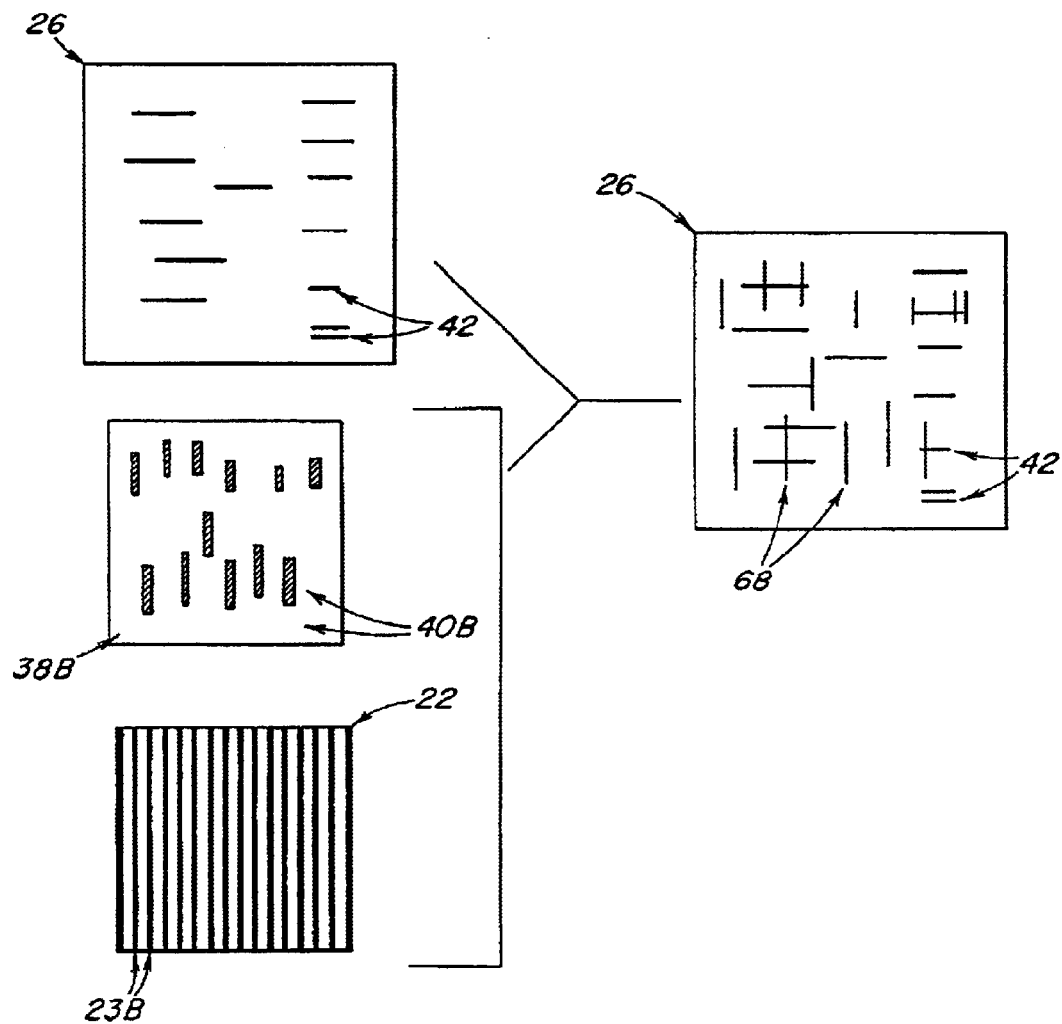
FIG. 17 is a graphical flow diagram illustrating the extension of this method to produce sets of fine features with different orientations and position offsets.

Since the imaging of each set of exposures, in the present invention, is independent of the previous exposures, the method of the present invention can be used to produce fine features such as transistor gates with multiple orientations and/or offsets. This is illustrated in FIG. 17.

With respect to producing fine features with multiple orientations and/or offsets, first the approach illustrated in FIG. 12 is used to create fine features in one orientation. More specifically, a substrate is photolithographically exposed with a dense-grating mask to provide a first exposed pattern on the substrate. The substrate is then photolithographically exposed with a trim mask to trim the first exposed pattern to provide multiple trimmed patterns 42 on the substrate 26 as illustrated in FIG. 17.

Next, the substrate 26 is recoated with resist and photolithographically exposed with a dense-grating mask 22 with another orientation or offset 23B. Then, the substrate is photolithographically exposed with a trim mask 38B with pattern 40B to trim this second dense grating pattern to provide a second set of multiple trimmed patterns 68 on wafer 26. Thus, two sets of multiple trimmed patterns are formed 42 and 68 each having its own orientation and offset. As an alternative to the second resist coat, a hardmask or double bilayer resist process can also be used in the same manner as described below with respect to FIGS. 13 and 14.

Figure 14:
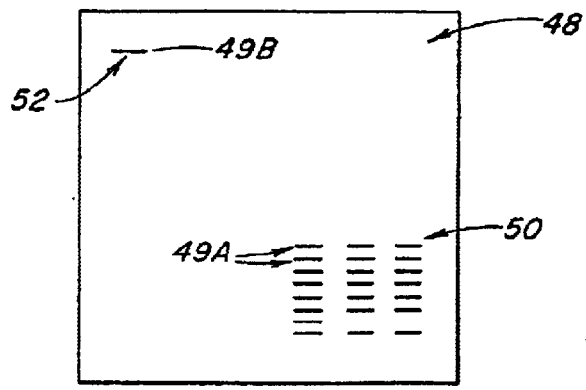
FIG. 14 is a top view of trimmed fine features formed according to the technique of the present invention illustrating the absence of optical proximity effects.

With respect to the processes illustrated in FIGS. 13 and 14, a substrate is first photolithographically exposed with a dense-grating mask to provide a first exposed pattern on the substrate. The substrate is next photolithographically exposed with a trim mask to trim the first exposed pattern to provide multiple trimmed patterns on the substrate. Next, the substrate is recoated with resist and photolithographically exposed with an interconnect mask to provide an interconnect pattern on the trimmed pattern for interconnecting a subset of the multiple trimmed patterns.

As an alternative to the second resist coat, a hardmask or double bilayer resist process can also be used. In a hardmask process, an additional masking layer, typically silicon nitride or silicon dioxide, is formed on the wafer prior to resist coating. This layer is defined and etched to form a mask that can be used in processing of the underlying substrate. In a double bilayer process, two layers of resist are formed such that patterns formed in the top layer of resist are used to locally control the removal of the bottom layer of resist such that a pattern formed in the bottom layer of resist corresponds to the geometric union of multiple exposures.

A less general dense-feature pattern can also be used which eliminates the need for a third exposure.

According to the concepts of the present invention, lithographically exposing the substrate with a dense feature mask provides a first exposed pattern having a predetermined critical dimension. In this case, following photolithographically exposing the substrate again with the trim mask, the multiple trimmed patterns have substantially the same critical dimension.

A first subset of the multiple trimmed patterns may be located in a sparsely populated region of the substrate, and a second subset of the multiple trimmed patterns may be located in a densely populated region of the substrate. The first subset and second subset of patterns have substantially the same critical dimension. This is illustrated in FIG. 12 (42) and FIG. 14 (49A and 49B). The multiple trimmed patterns may comprise transistors wherein the critical dimension represents the length of the gate length of each transistor.

The substrate may comprise a semiconductor substrate having a first photo-resist layer, wherein the multiple trimmed patterns are provided in the first photoresist layer, and wherein following photolithographically exposing the substrate with the trim mask, the first photoresist layer is developed. Following developing of the first photoresist layer, a second photoresist layer may be formed over the developed first photoresist layer, in which case, the interconnect pattern is provided in the second photoresist layer.

Another embodiment uses a less general dense-feature pattern on the photomask. This pattern is then "customized" by the second trim exposure into a desired circuit pattern. This embodiment only requires two exposures and does not require a second resist coat. This embodiment is illustrated in FIG. 16.

Other possible embodiments involve the triple-exposure method described above with the second resist replaced by either a hardmask or double bilayer resist process.

The dense-pattern features can be generated by either photomasks or other imaging/patterning methods not necessary produced by optical mask projection methods. Such methods may include laser interferometry or nano-imprint methods. When photomasks are used, a preferred embodiment utilizes phase-shift masks to generate the dense-feature patterns.

In interference lithography, fine features are centered on regions of destructive interference; i.e., nulls. In phase-shift lithography, these nulls correspond to the boundary of a particular transmitting region on a mask, and a second transmitting region with a phase-shift typically of about 180 degrees. In some applications, phase shift masks with phase shifts between zero and ±180 degrees may be used.

An attenuating phase shift mask (APSM) is a phase shift mask in which there are multiple regions. A set of regions is included for which there is a relative phase shift of zero degrees and a transmissivity between zero and one. Other sets of regions have a phase shift typically of about 180 degrees and a transmissivity between zero and one. In some applications, attenuating phase shift masks with phase shifts between zero and ±180 degrees may be used.

In laser interferometry, these nulls correspond to regions of destructive interference of two wavefronts. The critical dimension in resist of interferometrically-defined features (phase-shift or otherwise) is determined by the exposure dose. Thus, for a single exposure in which all features receive the same dose, one critical dimension is defined at each null. Conventionally forming these critical dimensions is not addressed during a single phase-shift exposure. It would be beneficial for multiple fine line critical dimensions to be defined in resist during a single phase-shift exposure.

In the present invention, multiple fine line critical dimensions are defined in resist during a single feature definition exposure by adding a sub-threshold exposure of a gray-tone mask to locally partially expose different regions of a substrate, thereby allowing for a range of fine line critical dimensions to be defined by the feature definition exposure. This gray-tone mask can be implemented as a mask with varying degrees of transmission or as a pixellated mask with features below the pitch resolution of the stepper that produce a similar dose variation effect.

To simplify the gray scale mask fabrication process, the stepper resolution can be intentionally worsened or degraded during the gray scale exposure by a detuning method. For example, the detuning can be realized by the partial coherence of the exposure being decreased or the numerical aperture of the lens (NA) being decreased. This detuning permits a larger pixellation pitch to be used on the mask, thus decreasing the mask write time and resolution requirements.

The two most difficult patterning levels in semiconductor processing are transistor gates and contact holes. Attenuating phase-shift masks have been conventionally used to increase the resolution and process latitude for leading edge applications requiring small contact holes. The transmission of these attenuated phase-shift masks has been limited to around 6% due to the problem of sidelobe printing at larger transmission values. In addition, the correction of optical proximity effects is difficult for leading edge contact patterns with complex ternary masks sometimes being used. In addition to considerably increasing mask fabrication complexity, the conventional approaches do not allow for maximum packing density due to the area they consume. An example of a conventional method uses a darkfield mask tone with binary masks with sub-resolution OPC features.

The present invention uses "dense-only" attenuated phase-shift masks to fabricate random contact patterns. The method, according to the concepts of the present invention, involves the use of two exposures. The first exposure uses a dense pillar array, using a brightfield attenuated phase-shift mask, which images a dense array of holes using a negative resist. The brightfield mask tone used is important for improving the process latitude. The second exposure trims out the undesired contact features. The sum of these two exposures produces a random array of holes.

Since only dense contact features are imaged, proximity and sidelobe effects are eliminated. Thus, the use of complex ternary or OPC contact masks is not required. Since sidelobe effects are absent, the use of high transmission attenuated phase-shift masks is possible, greatly improving lithographic performance. In fact, "chromeless" attenuated phase-shift masks can be used where the transmission of the patterned regions is 100%. The present invention uses a brightfield mask tone together with high transmission attenuated phase-shift mask and full exposure doses for each level.

The present invention is also directed to a design methodology. In this methodology, according to the present invention, standard circuit subcell designs are designed or laid out wherein all fine features lie on a regular pattern. The standard circuit subcell designs are compatible with a method of forming patterns on a substrate by exposing the substrate to provide a pattern of regular dense features of a predetermined pitch and critical dimension and exposing the substrate to provide multiple trimmed patterns on the substrate, the trimmed patterns including both densely populated and sparsely populated regions of features, the critical dimension of the features in the densely populated regions and sparsely populated regions being substantially independent of feature density.

In another embodiment, the methodology designs standard circuit subcells wherein all fine features lie on a regular pattern, and the standard circuit subcell designs are compatible with a mask set for providing patterns on a substrate having a fine feature mask containing a pattern of regular dense features and a trim mask for producing multiple trimmed patterns of fine features.

The present invention also contemplates a computer-aided or non-computer aided design methodology. This methodology assumes a first template of dense-only features as a first mask level and places a first set of trim features on a second mask level to coincide with selected features on the first template, such that a first subset or superset of features desired for fabrication correspond to a geometric function of the first template and the first set of trim features. The computer-aided methodology can further place additional features on additional mask levels, such that features desired for fabrication correspond to a geometric function of the first subset or superset of features desired for fabrication (CUT: of the trim features) and the additional features, the geometric function being determined by a destination lithographic process in which the imaging of the first subset or superset of features desired for fabrication of the trim features and the imaging of the additional features are substantially independent. The placing of additional features can be defined by assuming a second template of dense-only features as a first mask level and placing a second set of trim features on a second mask level to coincide with selected features on the second template, a second subset or superset of features desired for fabrication corresponding to a geometric function of the second template and the second set of trim features; or by placing additional features on additional mask levels, such that features desired for fabrication correspond to a geometric function of the second subset or superset of features desired for fabrication (CUT: of the trim features) and the additional features, the geometric function being determined by a destination lithographic process in which the imaging of the second subset or superset of features desired for fabrication (CUT: of the trim features) and the imaging of the additional features are substantially independent.

In summary, the present invention is directed to an imaging approach that overcomes the limitations of the conventional techniques, and confers a number of advantages. Optical proximity effects are effectively eliminated, thereby eliminating the need for costly and complex optical proximity correction Spatial frequency effects such as corner rounding and line-end shortening are minimized as well through the use of multiple, substantially independent optical exposures. These attributes allow for maximum pattern density and flexibility for applications.

In accordance with the concepts of the present invention, superior dimension control is provided through pitch. The entire fine-line imaging process can be optimized for "dense-only" features thus permitting densities otherwise unachievable. Mask fabrication and inspection is simplified through the use of potentially re-usable regular feature arrays, thus lowering cost. The circuit design cycle is also shortened since library cells may be pre-characterized in a manner that is independent of cell placement.

The present invention forms dense and regular features and remove those that are undesirable, thereby avoiding simultaneously creating dense and isolated features. This is useful for patterns involving sub-wavelength feature sizes and narrow pitch values. In a preferred embodiment, the reticle is patterned to provide a regular array of densely populated narrow features on the wafer that are consistent in size and shape. A trimming process is then used to remove undesired features.

The present invention also avoids circuit density penalties resulting from constraint of fine features in which tight size tolerance is essential to one orientation and grid position offset by adequately providing for the geometric union of exposures at the wafer plane and allowing certain exposures or sets of exposures to have imaging that is substantially independent from that of previous exposures or sets of exposures.

As noted before, the above description refers to gate patterns made using positive photoresist. The same process with negative photoresist will make "trench" patterns useful for damascene gate applications for example. The preferred embodiment also utilizes a phase-shift mask to produce the dense features. These dense regular features could also be produced with other, non-optical mask projection methods such as laser interferometry or imprint/embossing methods.

The preferred embodiment describes the layout and fabrication of narrow line features that could represent transistor gate features. Alternate embodiments of the same method can be used to produce random contact hole or pillar arrays. These methods could form a dense contact/pillar pattern by multiple exposures of dense feature patterns with different offsets and/or orientations. Alternatively, dense contact patterns can be formed by an attenuated phase-shift mask and subsequently trimmed to form a random array. The resist's tone determines whether contacts or pillars are formed in this way.

The preferred embodiment describes a dual resist process. Alternative embodiments could utilize either a hardmask process, in which an additional masking layer, typically silicon nitride or silicon dioxide, is formed on the wafer prior to resist coating, this layer being defined and etched to form a mask that can be used in processing of the underlying substrate; or double bilayer resist processes in which two layers of resist are formed, such that patterns formed in the top layer of resist mask correspond to removal of the bottom layer of resist and a pattern formed in the bottom layer of resist corresponds to the geometric union of multiple exposures.

Any multiple layer resist process, in which the photo-induced reaction of a particular layer is substantially independent of the photo-induced reaction of another layer, can be utilized with the present invention. Also, any resist process in which multiple substantially independent photo-induced reactions occur within the same layer of resist can be used.

While the present invention has been particularly shown and described with references to preferred embodiments thereof, it will be understood by those skilled in the art that various changes in form and detail may be made herein without departing from the spirit and scope of the invention as defined by the appended claims.

What is claimed is:

1. A method of forming patterns on a substrate comprising:
   (a) exposing the substrate to provide a pattern of dense features;
   (b) exposing the substrate to provide multiple trimmed patterns on the substrate, the trimmed patterns including both densely populated and sparsely populated regions of features, the critical dimension of the features in the densely populated regions and sparsely populated regions being substantially independent of feature density; and
   (c) exposing the substrate to image additional features on a same lithography level as the dense features, the imaging of the additional features being substantially independent of previous exposures, the imaging of the additional features providing a geometric union operation.

2. The method as claimed in claim 1, wherein the pattern of dense features is formed by nano-imprint technology.

3. The method as claimed in claim 1, wherein the pattern of dense features is formed using off-axis illumination.

4. The method as claimed in claim 1, wherein the pattern of dense features is a pattern of regular dense features.

5. The method as claimed in claim 1, wherein the pattern of dense features is a pattern of dense features of a predetermined pitch and critical dimension.

6. The method as claimed in claim 1, wherein the pattern of dense features is a pattern of regular dense features of a predetermined pitch and critical dimension.

7. The method as claimed in claim 1, wherein the substrate is photolithographically exposed to provide a pattern of dense features.

8. The method as claimed in claim 1, wherein the substrate is photolithographically exposed to provide multiple trimmed patterns on the substrate, the trimmed patterns including both densely populated and sparsely populated regions of features.

9. The method as claimed in claim 1, wherein the substrate is photolithographically exposed to provide the additional features.

10. The method as claimed in claim 1, wherein the pattern, formed by exposing the substrate to provide a pattern of dense features, is produced by a phase-shift mask.

11. The method as claimed in claim 10, wherein the phase-shift mask includes globally periodic features.

12. The method as claimed in claim 10, wherein the phase-shift mask includes locally periodic features.

13. The method as claimed in claim 10, wherein the phase-shift mask includes printable features, corresponding to features desired on the substrate, and sub-resolution features.

14. The method as claimed in claim 13, wherein the sub-resolution features of the phase-shift mask, when used to expose the substrate, result in the formation of solid patterns on the substrate.

15. The method as claimed in claim 14, wherein the solid patterns interconnect narrow patterns corresponding to the printable features.

16. The method as claimed in claim 1, wherein the pattern, formed by exposing the substrate to provide a pattern of dense features, is provided by interferometry.

17. The method as claimed in claim 1, wherein the pattern, formed by exposing the substrate to provide multiple trimmed patterns on the substrate, is provided by a conventional chrome-on-glass photomask.

18. The method as claimed in claim 1, wherein the substrate is a semiconductor substrate having a first photoresist layer, and wherein the multiple trimmed patterns are provided in the first photoresist layer and wherein following exposing the substrate to provide multiple trimmed patterns, the first photoresist layer is developed.

19. The method as claimed in claim 18, wherein following developing of the first photoresist layer, a second photoresist layer is formed over the developed first photoresist layer and wherein the pattern formed by exposing the substrate to provide additional features is provided in the second photoresist layer.

20. The method as claimed in claim 1, wherein the substrate is a semiconductor substrate having multiple stacked photoresist layers and the multiple trimmed patterns are provided in the first stacked photoresist layer.

21. The method as claimed in claim 20, wherein the pattern formed by exposing the substrate to provide additional features is provided in a second stacked photoresist layer.

22. The method as claimed in claim 20, wherein the multiple stacked layers of photoresist consist of a double bilayer resist.

23. The method as claimed in claim 21, wherein the multiple stacked layers of photoresist consist of a double bilayer resist.

24. The method as claimed in claim 20, wherein the multiple stacked layers of photoresist consist of resist layers each having a different sensitivity to exposure parameters, such that each layer may be independently exposed by varying the parameters of the corresponding exposure.

25. The method as claimed in claim 21, wherein the multiple stacked layers of photoresist consist of resist layers each having a different sensitivity to exposure parameters, such that each layer may be independently exposed by varying the parameters of the corresponding exposure.

26. The method as claimed in claim 20, wherein a photo-induced reaction of a particular resist layer is substantially independent of a photo-induced reaction of another layer.

27. The method as claimed in claim 21, wherein a photo-induced reaction of a particular resist layer is substantially independent of a photo-induced reaction of another layer.

28. The method as claimed in claim 1, wherein the substrate is a semiconductor substrate having a photoresist layer in which multiple substantially independent photo-induced reactions can occur, and wherein the multiple trimmed patterns are provided in the first of these substantially independent photo-induced reactions.

29. The method as claimed in claim 28, wherein the pattern formed by exposing the substrate to provide additional features is provided in a second of these substantially independent photo-induced reactions.

30. The method as claimed in claim 1, wherein the multiple trimmed patterns are transistor gates, and wherein the critical dimension represents the length of the gate of each transistor.

31. The method as claimed in claim 1, wherein the additional features correspond to interconnect features.

32. The method as claimed in claim 1, wherein exposing the substrate to provide additional features exposes the substrate to provide a pattern of dense features and exposes the substrate to provide multiple trimmed patterns on the substrate, the trimmed patterns including both densely populated and sparsely populated regions of features, the critical dimension of the features in the densely populated regions and sparsely populated regions being substantially independent of feature density.

33. The method as claimed in claim 32, wherein exposing the substrate to provide additional features exposes the substrate to provide a pattern of regular dense features.

34. The method as claimed in claim 32, wherein exposing the substrate to provide additional features exposes the substrate to provide a pattern of dense features of a predetermined pitch and critical dimension.

35. The method as claimed in claim 32, wherein exposing the substrate to provide additional features exposes the substrate to provide a pattern of regular dense features of a predetermined pitch and critical dimension.

36. The method as claimed in claim 1, wherein exposing the substrate to provide additional features photolithographically exposes the substrate to provide a pattern of dense features and photolithographically exposes the substrate to provide multiple trimmed patterns on the substrate, the trimmed patterns including both densely populated and sparsely populated regions of features, the critical dimension of the features in the densely populated regions and sparsely populated regions being substantially independent of feature density.

37. The method as claimed in claim 36, wherein exposing the substrate to provide additional features photolithographically exposes the substrate to provide a pattern of regular dense features.

38. The method as claimed in claim 36, wherein exposing the substrate to provide additional features photolithographically exposes the substrate to provide a pattern of dense features of a predetermined pitch and critical dimension.

39. The method as claimed in claim 36, wherein exposing the substrate to provide additional features photolithographically exposes the substrate to provide a pattern of regular dense features of a predetermined pitch and critical dimension.

40. The method as claimed in claim 32, wherein the multiple trimmed patterns are transistor gates, and wherein the critical dimension represents the length of the gate of each transistor.

41. The method as claimed in claim 36, Wherein the multiple trimmed patterns are transistor gates, and wherein the critical dimension represents the length of the gate of each transistor.

42. The method as claimed in claim 40, wherein two sets of multiple trimmed patterns corresponding to transistor gates are transistor gates in two offsets.

43. The method as claimed in claim 40, wherein two sets of multiple trimmed patterns corresponding to transistor gates are transistor gates in two orientations.

44. The method as claimed in claim 41, wherein two sets of multiple trimmed patterns corresponding to transistor gates are transistor gates in two offsets.

45. The method as claimed in claim 41, wherein two sets of multiple trimmed patterns corresponding to transistor gates are transistor gates in two orientations.

46. The method as claimed in claim 1, wherein the substrate is a semiconductor substrate having a first photoresist layer and a hardmask, and wherein the multiple trimmed patterns are provided in the first photoresist layer and wherein following exposing the substrate to provide trimmed patterns, the first photoresist layer is developed and the resulting pattern transferred to the hardmask and the photoresist layer is removed.

47. The method as claimed in claim 46, wherein following transfer of the resulting layer to the hardmask and photoresist layer removal, a second photoresist layer is formed over the hardmask pattern.

48. The method as claimed in claim 47, wherein the pattern formed by exposing the substrate to provide additional features is provided in the second photoresist layer.

49. The method as claimed in claim 1, wherein any exposure of the substrate consists of a sequence of sub-threshold and/or above threshold exposures.

50. The method as claimed in claim 49, in which a sub-threshold exposure is used to locally modify the critical dimension produced by exposing the substrate to provide a pattern of regular dense features.

51. The method as claimed in claim 47, in which a sub-threshold exposure is used to locally modify the critical dimension produced by exposing the substrate to provide a pattern of regular dense features.

52. The method as claimed in claim 10, wherein the phase-shift mask includes chrome features that correspond to solid patterns that interconnect narrow patterns corresponding to the phase-shift defined features.

53. The method as claimed in claim 1, wherein the multiple trimmed patterns correspond to contact cuts or pillars.

54. The method as claimed in claim 53, wherein exposing the substrate to provide a pattern of regular dense features is performed using an attenuating phase-shift mask.

55. The method as claimed in claim 1, wherein the multiple trimmed patterns correspond to features in a photonic crystal.

56. The method as claimed in claim 31, wherein the interconnect features are used to form transistor gates.

57. The method as claimed in claim 1, wherein the substrate is a semiconductor substrate having a positive photoresist layer.

58. The method as claimed in claim 1, wherein the substrate is a semiconductor substrate having a negative photoresist layer.

59. The method as claimed in claim 10, wherein the phase-shift mask includes optical proximity correction.

60. The method as claimed in claim 10, wherein the phase-shift mask includes spatial frequency correction.

61. The method as claimed in claim 10, wherein the phase-shift mask includes optical proximity correction and spatial frequency correction.

62. The method as claimed in claim 1, wherein the pattern, formed by exposing the substrate to provide multiple trimmed patterns, is produced by a trim mask.

63. The method as claimed in claim 62, wherein the trim mask includes optical proximity correction.

64. The method as claimed in claim 62, wherein the trim mask includes spatial frequency correction.

65. The method as claimed in claim 62, wherein the trim mask includes optical proximity correction and spatial frequency correction.

66. The method as claimed in claim 1, wherein said exposing the substrate to provide the pattern of dense features comprises exposing the substrate with a dense feature pattern having a first orientation and exposing the substrate with the dense feature pattern having a second orientation.

67. The method of claim 66, wherein the first orientation is orthogonal to the second orientation.

68. The method as claimed in claim 1, wherein said exposing the substrate to provide the pattern of dense features comprises exposing the substrate with a dense feature pattern having a first position offset and exposing the substrate with the dense feature pattern having a second position offset.

69. The method as claimed in claim 1, wherein said exposing the substrate to provide the pattern of dense features comprises exposing the substrate with a dense grating having a first orientation and exposing the substrate with the dense grating having a second orientation.

70. The method of claim 69, wherein the first orientation is orthogonal to the second orientation.

71. The method of claim 66, wherein exposing the substrate with a dense feature pattern is performed using a phase shift mask.

72. The method of claim 67, wherein exposing the substrate with a dense feature pattern is performed using a phase shift mask.

73. The method of claim 68, wherein exposing the substrate with a dense feature pattern is performed using a phase shift mask.

74. The method of claim 69, wherein exposing the substrate with a dense feature pattern is performed using a phase shift mask.

75. The method of claim 71, wherein the phase shift mask is an attenuating phase shift mask.

76. The method of claim 72, wherein the phase shift mask is an attenuating phase shift mask.

77. The method of claim 73, wherein the phase shift mask is an attenuating phase shift mask.

78. The method of claim 74, wherein the phase shift mask is an attenuating phase shift mask.

79. The method as claimed in claim 1, wherein the pattern of dense features is a pattern of dense holes.

80. The method as claimed in claim 1, wherein the pattern of dense features is a pattern of dense pillars.

81. The method as claimed in claim 79, wherein the pattern, formed by exposing the substrate to provide a pattern of dense holes, is produced by an attenuating phase-shift mask.

82. The method as claimed in claim 80, wherein the pattern, formed by exposing the substrate to provide a pattern of dense pillars, is produced by an attenuating phase-shift mask.

83. The method as claimed in claim 59, wherein the pattern, formed by exposing the substrate to provide a pattern of regular dense pillars of a predetermined pitch and critical dimension, is produced by an attenuating phase-shift mask.

84. The method as claimed in claim 79, wherein said exposing the substrate to provide multiple trimmed patterns on the substrate form a random contact array.

85. The method as claimed in claim 80, wherein said exposing the substrate to provide multiple trimmed patterns on the substrate form a random contact array.

86. A mask set for a process for providing patterns on a substrate comprising:
   a fine feature mask containing a pattern of dense features;
   a trim mask for producing multiple trimmed patterns of fine features; and
   an additional mask or set of masks to provide additional features on a same lithography level as said dense features wherein the imaging of the additional features being substantially independent of the previous exposures and the imaging of the additional features provide a geometric union operation.

87. The mask set as claimed in claim 86, wherein said fine feature mask contains a pattern of regular dense features.

88. The mask set as claimed in claim 86, wherein said fine feature mask contains a pattern of dense features of a predetermined pitch and critical dimension.

89. The mask set as claimed in claim 86, wherein said fine feature mask contains a pattern of regular dense features of a predetermined pitch and critical dimension.

90. The mask set as claimed in claim 86, wherein trim features on said trim mask correspond to transistor gates located on a regular pattern.

91. The mask set as claimed in claim 86, wherein the fine feature mask includes globally periodic features.

92. The mask set as claimed in claim 86, wherein fine feature mask includes locally periodic features.

93. The mask set as claimed in claim 86, wherein trim features on said trim mask correspond to hole or pillar features located on a regular pattern.

94. The mask set as claimed in claim 86, wherein trim features on the trim mask correspond to interconnect segments located on a regular pattern.

95. The mask set as claimed in claim 86, wherein trim features on said trim mask correspond to transistor gates located on a regular pattern.

96. The mask set as claimed in claim 86, wherein trim features on said trim mask correspond to hole or pillar features located on an optically dense feature pattern.

97. The mask set as claimed in claim 86, wherein trim features on the trim mask correspond to interconnect segments located on an optically dense feature pattern.

98. The mask set as claimed in claim 86, wherein said fine feature mask is replaced by an interferometric pattern.

99. A method comprising:
(a) designing standard circuit subcell designs wherein all fine features lie on a regular pattern, the designed standard circuit subcell designs being governed by method of forming patterns on a substrate by exposing the substrate to provide a pattern of dense features, exposing the substrate to provide multiple trimmed patterns on the substrate, the trimmed patterns including both densely populated and sparsely populated regions of features, the critical dimension of the features in the densely populated regions and sparsely populated regions being substantially independent of feature density, and exposing the substrate to image additional features on a same lithography level as the dense features, the imaging of the additional features being substantially independent of previous exposures, the imaging of the additional features providing a geometric union operation.

100. The method as claimed in claim 99, wherein the pattern of dense features is a pattern of regular dense features.

101. The method as claimed in claim 99, wherein the pattern of dense features is a pattern of dense features of a predetermined pitch and critical dimension.

102. The method as claimed in claim 99, wherein the pattern of dense features is a pattern of regular dense features of a predetermined pitch and critical dimension.

103. A method comprising:
(a) designing standard circuit subcell designs wherein all fine features lie on a regular pattern, the designed standard circuit subcell designs being governed by a mask set for providing patterns on a substrate having a fine feature mask containing a pattern of dense features, a trim mask for producing multiple trimmed patterns of fine features, and an additional mask or set of masks to provide additional features on a same lithography level as said dense features wherein the imaging of the additional features being substantially independent of the previous exposures and the imaging of the additional features provide a geometric union operation.

104. The method as claimed in claim 103, wherein said designing standard circuit subcell designs being compatible with a method forming patterns on a substrate by exposing the substrate to provide a pattern of dense features and exposing the substrate to provide multiple trimmed patterns on the substrate, the trimmed patterns including both densely populated and sparsely populated regions of features, the critical dimension of the features in the densely populated regions and sparsely populated regions being substantially independent of feature density.

105. The method as claimed in claim 104, wherein the pattern of dense features is a pattern of regular dense features.

106. The method as claimed in claim 105, wherein the pattern of dense features is a pattern of dense features of a predetermined pitch and critical dimension.

107. The method as claimed in claim 106, wherein the pattern of dense features is a pattern of regular dense features of a predetermined pitch and critical dimension.

108. A computer-aided design methodology, comprising:
(a) assuming a first template of dense-only features as a first mask level;
(b) placing a first set of trim features on a second mask level to coincide with selected features on the first template, such that a first subset or superset of features desired for fabrication correspond to a geometric function of the first template and the first set of trim features; and
(c) placing additional features on additional mask levels, such that features desired for fabrication correspond to a geometric function of the first subset or superset of features desired for fabrication and the additional features, the geometric function being determined by a destination lithographic process in which the imaging of the first subset or superset of features desired for fabrication and the imaging of the additional features are substantially independent.

109. The computer-aided design methodology as claimed in claim 108, wherein the placing of additional features are defined by assuming a second template of dense-only features as a first mask level and placing a second set of trim features on a second mask level to coincide with selected features on the second template, a second subset or superset of features desired for fabrication corresponding to a geometric function of the second template and the second set of trim features.

110. The computer-aided design methodology as claimed in claim 109, wherein the placing of additional features are further defined by placing additional features on additional mask levels, such that features desired for fabrication correspond to a geometric function of the second subset or superset of features desired for fabrication and the additional features, the geometric function being determined by a destination lithographic process in which the imaging of the second subset or superset of features desired for fabrication and the imaging of the additional features are substantially independent.

111. A design methodology, comprising:
(a) assuming a first template of dense-only features as a first mask level;
(b) placing a first set of trim features on a second mask level to coincide with selected features on the first template, such that a first subset or superset of features desired for fabrication correspond to a geometric function of the first template and the first set of trim features; and (c) placing additional features on additional mask levels, such that features desired for fabrication correspond to a geometric function of the first subset or superset of features desired for fabrication and the additional features, the geometric function being determined by a destination lithographic process in which the imaging of the first subset or superset of features desired for fabrication and the imaging of the additional features are substantially independent.

112. The design methodology as claimed in claim 111, wherein the placing of additional features are defined by assuming a second template of dense-only features as a first mask level and placing a second set of trim features on a second mask level to coincide with selected features on the second template, a second subset or superset of features desired for fabrication corresponding to a geometric function of the second template and the second set of trim features.

113. The design methodology as claimed in claim 112, wherein the placing of additional features are further defined by placing additional features on additional mask levels, such that features desired for fabrication correspond to a geometric function of the second subset or superset of features desired for fabrication and the additional features, the geometric function being determined by a destination lithographic process in which the imaging of the second subset or superset of features desired for fabrication and the imaging of the additional features are substantially independent.

114. A method of forming a random contact array on a substrate comprising:

(a) exposing the substrate to provide a pattern of dense contact features of a predetermined pitch and critical dimension;

(b) exposing the substrate to provide multiple trimmed patterns on the substrate, the trimmed patterns including both densely populated and sparsely populated regions of features, the critical dimension of the features in the densely populated regions and sparsely populated regions being substantially independent of feature density; and (c) exposing the substrate to image additional features on a same lithography level as the dense features, the imaging of the additional features being substantially independent of previous exposures, the imaging of the additional features providing a geometric union operation.

115. The method as claimed in claim 114, wherein the substrate is photolithographically exposed to provide a pattern of regular contact features of a predetermined pitch and critical dimension.

116. The method as claimed in claim 114, wherein the substrate is photolithographically exposed to provide multiple trimmed patterns on the substrate, the trimmed patterns including both densely populated and sparsely populated regions of features.

117. The method as claimed in claim 114, wherein the pattern, formed by exposing the substrate to provide a pattern of regular dense contact features of a predetermined pitch and critical dimension, is produced by an attenuating phase-shift mask.

118. The method as claimed in claim 114, wherein the pattern of regular dense contact features is a pattern of regular dense holes.

119. The method as claimed in claim 114, wherein the pattern of regular dense contact features is a pattern of regular dense pillars.

120. The method as claimed in claim 117, wherein the pattern of regular dense contact features is a pattern of regular dense holes.

121. The method as claimed in claim 117, wherein the pattern of regular dense contact features is a pattern of regular dense pillars.

122. The method as claimed in claim 114, wherein said exposing the substrate to provide the pattern of regular dense contact features of a predetermined pitch and critical dimension comprises exposing the substrate with a dense feature pattern having a first orientation and exposing the substrate with the dense feature pattern having a second orientation.

123. The method as claimed in claim 114, wherein said exposing the substrate to provide the pattern of regular dense contact features of a predetermined pitch and critical dimension comprises exposing the substrate with a dense feature pattern having a first offset and exposing the substrate with the dense feature pattern having a second offset.

124. The method as claimed in claim 118, wherein said exposing the substrate to provide the pattern of regular dense holes of a predetermined pitch and critical dimension comprises exposing the substrate with a dense feature pattern having a first orientation and exposing the substrate with the dense feature pattern having a second orientation.

125. The method as claimed in claim 118, wherein said exposing the substrate to provide the pattern of regular dense holes of a predetermined pitch and critical dimension comprises exposing the substrate with a dense feature pattern having a first offset and exposing the substrate with the dense feature pattern having a second offset.

126. The method as claimed in claim 119, wherein said exposing the substrate to provide the pattern of regular dense pillars of a predetermined pitch and critical dimension comprises exposing the substrate with a dense feature pattern having a first orientation and exposing the substrate with the dense feature pattern having a second orientation.

127. The method as claimed in claim 119, wherein said exposing the substrate to provide the pattern of regular dense pillars of a predetermined pitch and critical dimension comprises exposing the substrate with a dense feature pattern having a first offset and exposing the substrate with the dense feature pattern having a second offset.

128. The method as claimed in claim 117, wherein said exposing the substrate to provide the pattern of regular dense contact features of a predetermined pitch and critical dimension comprises exposing the substrate with the attenuating phase-shift mask having a first orientation and exposing the substrate with the attenuating phase-shift mask having a second orientation.

129. The method as claimed in claim 117, wherein said exposing the substrate to provide the pattern of regular dense contact features of a predetermined pitch and critical dimension comprises exposing the substrate with the attenuating phase-shift mask having a first offset and exposing the substrate with the attenuating phase-shift mask having a second offset.

130. The method as claimed in claim 120, wherein said exposing the substrate to provide the pattern of regular dense holes of a predetermined pitch and critical dimension comprises exposing the substrate with the attenuating phase-shift mask having a first orientation and exposing the substrate with the attenuating phase-shift mask having a second orientation.

131. The method as claimed in claim 120, wherein said exposing the substrate to provide the pattern of regular dense holes of a predetermined pitch and critical dimension comprises exposing the substrate with the attenuating phase-shift mask having a first offset and exposing the substrate with the attenuating phase-shift mask having a second offset.

132. The method as claimed in claim 121, wherein said exposing the substrate to provide the pattern of regular dense pillars of a predetermined pitch and critical dimension comprises exposing the substrate with the attenuating phase-shift mask having a first orientation and exposing the substrate with the attenuating phase-shift mask having a second orientation.

133. The method as claimed in claim 121, wherein said exposing the substrate to provide the pattern of regular dense pillars of a predetermined pitch and critical dimension comprises exposing the substrate with the attenuating phase-shift mask having a first offset and exposing the substrate with the attenuating phase-shift mask having a second offset.

134. The method as claimed in claim 122, wherein the first orientation being orthogonal to the second orientation.

135. The method as claimed in claim 124, wherein the first orientation being orthogonal to the second orientation.

136. The method as claimed in claim 126, wherein the first orientation being orthogonal to the second orientation.

137. The method as claimed in claim 128, wherein the first orientation being orthogonal to the second orientation.

138. The method as claimed in claim 130, wherein the first orientation being orthogonal to the second orientation.

139. The method as claimed in claim 132, wherein the first orientation being orthogonal to the second orientation.

140. The method as claimed in claim 114, wherein the pattern, formed by exposing the substrate to provide a pattern of regular dense contact features of a predetermined pitch and critical dimension, is produced by an attenuating phase-shift mask having a pattern consisting of a two-dimensional array of phase-shifted regions.

141. The method as claimed in claim 140, wherein the phase-shifted regions have a transmissivity between zero and one.

142. The method as claimed in claim 140, wherein a transmissivity of non-phase-shifted regions is one.

143. The method as claimed in claim 140, wherein a pattern produced by an attenuating phase-shift mask having a pattern consisting of orthogonal arrayed phase-shifted regions with chrome attenuation is a two-dimensional pattern of contacts formed by a single exposure using the attenuating phase-shift mask.

144. A method for defining multiple fine feature critical dimensions in a resist comprising:
(a) exposing a substrate with a feature definition exposure; and
(b) sub-threshold exposing the substrate using a gray-tone mask to locally partially expose different regions of the substrate, thereby allowing for a range of critical dimensions to be defined by the feature definition exposure, the gay-tone mask being a mask with sub-resolution features of varying pitch that produce a similar dose variation effect.

145. The method as claimed in claim 144, wherein the feature definition exposure is interference lithography.

146. The method as claimed in claim 144, wherein the feature definition exposure is phase-shift lithography.

147. The method as claimed in claim 144, wherein the gay-tone mask is a mask with varying degrees of transmissivity.

148. A method for defining multiple fine feature critical dimensions in a resist comprising:
(a) exposing a substrate with a feature definition exposure;
(b) sub-threshold exposing the substrate using a gray-tone mask to locally partially expose different regions of the substrate, thereby allowing for a range of critical dimensions to be defined by the feature definition exposure, the gray-tone mask being a mask with sub-resolution features of varying pitch that produce a similar dose variation effect; and
(c) degrading a stepper resolution during said sub-threshold exposing by a detuning method.

149. A method for defining multiple fine feature critical dimensions in a resist, comprising:
(a) exposing a substrate with a feature definition exposure;
(b) sub-threshold exposing the substrate using a gray-tone mask to locally partially expose different regions of the substrate, thereby allowing for a range of critical dimensions to be defined by the feature definition exposure, the gray-tone mask being a mask with sub-resolution features of varying pitch that produce a similar dose variation effect; and
(c) degrading a stepper resolution during said sub-threshold exposing by decreasing a partial coherence of an exposure.

150. A method for defining multiple fine feature critical dimensions in a resist, comprising:
(a) exposing a substrate with a feature definition exposure;
(b) sub-threshold exposing the substrate using a gray-tone mask to locally partially expose different regions of the substrate, thereby allowing for a range of critical dimensions to be defined by the feature definition exposure, the gray-tone mask being a mask with sub-resolution features of varying pitch that produce a similar dose variation effect; and
(c) degrading a stepper resolution during said sub-threshold exposing by decreasing a numerical aperture of a lens.

151. The method as claimed in claim 53, wherein exposing the substrate to provide a pattern of regular dense features is performed using a phase-shift mask.

152. The method as claimed in claim 79, wherein the pattern, formed by exposing the substrate to provide a pattern of dense holes, is produced by a phase-shift mask.

153. The method as claimed in claim 80, wherein the pattern, formed by exposing the substrate to provide a pattern of dense pillars, is produced by a phase-shift mask.

154. The method as claimed in claim 59, wherein the pattern, formed by exposing the substrate to provide a pattern of regular dense pillars of a predetermined pitch and critical dimension, is produced by a phase-shift mask.

155. The method as claimed in claim 114, wherein the pattern, formed by exposing the substrate to provide a pattern of regular dense contact features of a predetermined pitch and critical dimension, is produced by a phase-shift mask.

156. The method as claimed in claim 114, wherein the pattern, formed by exposing the substrate to provide a pattern of regular dense contact features of a predetermined pitch and critical dimension, is produced by a phase-shift mask having a pattern consisting of a two-dimensional array of phase-shifted regions.

157. The method as claimed in claim 140, wherein a pattern produced by a phase-shift mask having a pattern consisting of orthogonal arrayed phase-shifted regions with chrome attenuation is a two-dimensional pattern of contacts formed by a single exposure using the phase-shift mask.

* * * * *